(12) United States Patent
Ikeda et al.

(10) Patent No.: US 7,894,293 B2
(45) Date of Patent: Feb. 22, 2011

(54) MEMORY BANK ARRANGEMENT FOR STACKED MEMORY

(75) Inventors: Hiroaki Ikeda, Tokyo (JP); Kayoko Shibata, Tokyo (JP); Junji Yamada, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 1101 days.

(21) Appl. No.: 11/560,898

(22) Filed: Nov. 17, 2006

(65) Prior Publication Data

US 2007/0117317 A1 May 24, 2007

(30) Foreign Application Priority Data

Nov. 18, 2005 (JP) ............................. 2005-334413

(51) Int. Cl.
*G11C 8/00* (2006.01)
(52) U.S. Cl. .................... 365/230.03; 365/63; 365/222
(58) Field of Classification Search ............ 365/230.03, 365/63, 51, 222, 236
See application file for complete search history.

(56) References Cited

U.S. PATENT DOCUMENTS

| | | | | |
|---|---|---|---|---|
| 5,796,669 A | * | 8/1998 | Araki et al. ................. | 365/222 |
| 6,754,124 B2 | * | 6/2004 | Seyyedy et al. ............. | 365/214 |
| 7,123,497 B2 | * | 10/2006 | Matsui et al. .................. | 365/51 |
| 7,379,316 B2 | * | 5/2008 | Rajan ........................... | 365/63 |
| 7,402,897 B2 | * | 7/2008 | Leedy ......................... | 257/678 |
| 2004/0257847 A1 | * | 12/2004 | Matsui et al. ................. | 365/63 |
| 2007/0195613 A1 | * | 8/2007 | Rajan et al. ............ | 365/189.05 |

FOREIGN PATENT DOCUMENTS

| JP | 9-265774 | 10/1997 |
|---|---|---|
| JP | 2004-327474 | 11/2004 |

* cited by examiner

*Primary Examiner*—Tuan T Nguyen
*Assistant Examiner*—R Lance Reidlinger
(74) *Attorney, Agent, or Firm*—Whitham, Curtis, Christofferson & Cook, P.C.

(57) ABSTRACT

In a three-dimensional stacked memory having through electrodes, no optimal layer arrangement, bank arrangement, control methods have been established, and thus optimal methods are desired to be established. A stacked memory includes memory core layers, an interposer, and an IF chip. By stacking memory core layers having the same arrangement, it is possible to cope with both of no-parity operation and parity operation. Further, bank designation irrespective of the number of stacks of the memory core layers can be achieved by assignment of a row address and a bank address. Further, the IF chip has refresh counters for performing a refresh control of the stacked memory. This arrangement provides a stacked memory including stacked memory core layers having through electrodes.

18 Claims, 10 Drawing Sheets

| ONE LAYER | TWO LAYERS | FOUR LAYERS | EIGHT LAYERS |

(a)

| 1 | 2 | 3 | 4 |
|---|---|---|---|
| 5 | 6 | 7 | 8 |

(b)

| 1 | 2 | 3 | 4 |
|---|---|---|---|
| 5 | 6 | 7 | 8 |

| 9 | 10 | 11 | 12 |
|---|---|---|---|
| 13 | 14 | 15 | 16 |

(c)

| 1 | 2 | 3 | 4 |
|---|---|---|---|
| 5 | 6 | 7 | 8 |

| 9 | 10 | 11 | 12 |
|---|---|---|---|
| 13 | 14 | 15 | 16 |

| 17 | 18 | 19 | 20 |
|---|---|---|---|
| 21 | 22 | 23 | 24 |

| 25 | 26 | 27 | 28 |
|---|---|---|---|
| 29 | 30 | 31 | 32 |

3

(d)

| 1 | 2 | 3 | 4 |
|---|---|---|---|
| 5 | 6 | 7 | 8 |

| 9 | 10 | 11 | 12 |
|---|---|---|---|
| 13 | 14 | 15 | 16 |

| 17 | 18 | 19 | 20 |
|---|---|---|---|
| 21 | 22 | 23 | 24 |

| 25 | 26 | 27 | 28 |
|---|---|---|---|
| 29 | 30 | 31 | 32 |

| 33 | 34 | 35 | 36 |
|---|---|---|---|
| 37 | 38 | 39 | 40 |

| 41 | 42 | 43 | 44 |
|---|---|---|---|
| 45 | 46 | 47 | 48 |

| 49 | 50 | 51 | 52 |
|---|---|---|---|
| 53 | 54 | 55 | 56 |

| 57 | 58 | 59 | 60 |
|---|---|---|---|
| 61 | 62 | 63 | 64 |

MEMORY BANK ARRANGEMENT FOR STACKED MEMORY

This application claims priority to prior Japanese patent application JP 2005-334413, the disclosure of which is incorporated herein by reference.

BACKGROUND OF THE INVENTION

1. Field of the Invention

The present invention relates to a stacked memory having a plurality of stacked memory chips, and more particularly to a memory arrangement, a bank arrangement, and a refresh control of a stacked memory.

2. Description of the Related Art

Recently, electronic equipment has been miniaturized, and semiconductor devices used in electronic equipment also have been miniaturized. For example, small-sized electronic equipment such as cellular phones employs a three-dimensional stacked semiconductor device. The three-dimensional stacked semiconductor device has a plurality of stacked semiconductor chips, each of which is subjected to wire bonding so as to be housed in a single package. Thus, in order to achieve miniaturization of a semiconductor device, semiconductor chips are stacked so as to form a three-dimensional stacked semiconductor device.

In order to achieve further miniaturization and high-speed operation, there has recently been developed a stacked semiconductor device using through electrodes instead of wire bonding. In such a stacked semiconductor device, stacked semiconductor chips are connected to each other by through electrodes, which extend through the semiconductor chips. The use of through electrodes reduces a space and an inductor which would be caused by wire bonding, and allows a semiconductor device to achieve further miniaturization and high-speed operation.

A stacked memory with a plurality of stacked memory chips has been developed as one of such stacked semiconductor devices. A stacked memory can be substituted for a memory module by stacking a plurality of semiconductor chips. For example, such a stacked memory includes a stacked dynamic random access memory (DRAM) having stacked DRAM chips which are formed on memory core layers. When a stacked memory is substituted for a currently used memory or memory module, the stacked memory should be arranged so as to match specifications of the currently used memory or memory module. For example, design of memory core layers should be changed for parity operation and for no-parity operation. Specifically, x16-bit products should be changed into x18-bit products when the parity operation is executed. Further, it is to be noted that each of the DRAM chips tends to be divided into a plurality of banks. Under the circumstances, if the DRAM chips are simply stacked one upon another, the number of banks widely varies depending on the number of stacks. This requires preparation of a great number of DRAM specifications for every one of the bank numbers. Furthermore, any refresh control methods corresponding to a stacked structure have not been established yet.

With regard to a stacked semiconductor device having stacked semiconductor chips, the following references are known as the prior art. Japanese laid-open patent publication No. 9-265774 (Patent Document 1) discloses an interleave control performed between stacked memory chips in order to shorten access time. Japanese laid-open patent publication No. 2004-327474 (Patent Document 2) discloses a stacked memory that stacks an IO chip and a plurality of DRAM chips together. With this structure, the IO chip converts system data signals and internal data in the DRAM chips and controls the stacked memory.

Patent Document 1 discloses an improvement of an access method of a stacked memory but is silent on a bank arrangement or a refresh method of DRAM chips. According to Patent Document 2, it is assumed that each of the DRAM chips has a single bank arrangement. Accordingly, no problems arise with regard to a plural bank arrangement of the DRAM chips. Further, Patent Document 2 is silent on a refresh method of the DRAM chips. Thus, Patent Documents 1 and 2 do not recognize the aforementioned problems to be resolved by the present invention. Patent Documents 1 and 2 are silent on an arrangement of a stacked memory or an address assignment, and fail to teach or suggest any technology to resolve the aforementioned problems.

In addition, a stacked memory should also have a structure matched with specifications of the currently used memory or memory module. However, no methods have been established yet so as to be matched with such demands. Accordingly, an arrangement of semiconductor chips should be changed for parity operation and for no-parity operation. Specifically, x16-bit products for no-parity operation should be changed into x18-bit products for parity operation. Further, if stacking is simply conducted, the bank numbers should change according to the number of stacks, as mentioned before. Such a change of the bank numbers needs to change DRAM specifications for the bank numbers. Furthermore, no optimal refresh control methods corresponding to a stacked structure have been established yet.

SUMMARY OF THE INVENTION

The present invention has been made in view of the above drawbacks. It is, therefore, an object of the present invention to provide a stacked memory which can match currently used memory specifications with use of stacked memory chips having the same arrangement, and an arrangement method of such a stacked memory.

In order to resolve the above problems, the present invention basically adopts the following technology. As a matter of course, the present invention covers applied technology in which various changes and modifications are made therein without departing from the spirit of the present invention.

According to an aspect of the present invention, there is provided a stacked memory including memory core layers each having through electrodes and an interface chip. The stacked memory is operable to perform a parity operation or a no-parity operation in dependency upon absence or presence of a parity layer.

In the stacked memory, each of the memory core layers and the parity layer may have the same arrangement of a memory cell array and a peripheral circuit concerned with the memory cell array. The interface chip may have a memory input/output circuit mounted thereon. An interposer may have an external terminal mounted thereon. The layers may be connected by the through electrodes.

In the stacked memory, a layer of the memory core layers may be designated by a significant bit of a row address.

In the stacked memory, a bank of the stacked memory may be designated by a bank address and is made to correspond to a mat included in the memory core layer to thereby maintain a constant number of banks irrespective of the number of stacks of the memory core layers.

In the stacked memory, the parity layer may be designated by an address signal from the interface chip.

In the stacked memory, a bank of the parity layer may be designated by a significant bit of a bank address and a bit in which a least significant bit of the bank address is inversed.

In the stacked memory, parity information of a specific bank of the memory core layers may be stored in a submat within one mat of the parity layer.

In the stacked memory, the submat may be designated by a row address for designating a layer of the memory core layers.

In the stacked memory, a layer of the memory core layers maybe designated by a significant bit of a row address and a most significant bit of a bank address.

In the stacked memory, a bank of the stacked memory may be designated by specifying non-inversion, inversion, and invalidation of each bit of a bank address for each mat in the memory core layer and judging consistency or inconsistency with an inputted bank address.

In the stacked memory, a layer of the memory core layers may be designated by comparing a layer address and a layer selection address. A mat in a memory core layer designated by a mat selection signal from the interface chip may be designated as a bank of the stacked memory.

In the stacked memory, banks of the memory core layers may be grouped, and the interface chip may have refresh counters for refreshing each group of the banks of the memory core layers.

According to the present invention, by stacking memory core layers having the same arrangement, it is possible to cope with both of no-parity operation and parity operation. Further, bank designation irrespective of the number of stacks of the memory core layers can be achieved by assignment of a row address and a bank address. Further, it is possible to perform a refresh control of the stacked memory, such as Hidden Refresh. The above arrangement provides a stacked memory including stacked memory core layers having through electrodes.

The above and other objects, features, and advantages of the present invention will be apparent from the following description when taken in conjunction with the accompanying drawings which illustrate preferred embodiments of the present invention by way of example.

BRIEF DESCRIPTION OF THE DRAWINGS

FIG. 5 is a diagram showing conventional bank arrangements;

DESCRIPTION OF THE PREFERRED EMBODIMENTS

In order to facilitate an understanding of the present invention, a basic arrangement of stacked memories will be described below in detail with reference to FIGS. 1 through 4. At first, the stacked memory according to a preferred embodiment of the present invention includes an external terminal (interposer) layer 2 for connection with an external terminal, a plurality of memory core layers 3, and an input/output circuit (IF chip) layer 4, as illustrated in (b) in FIG. 1. Thus, the entire arrangement of the stacked memory according to the present invention is shown in FIG. 1.

Figure 2:
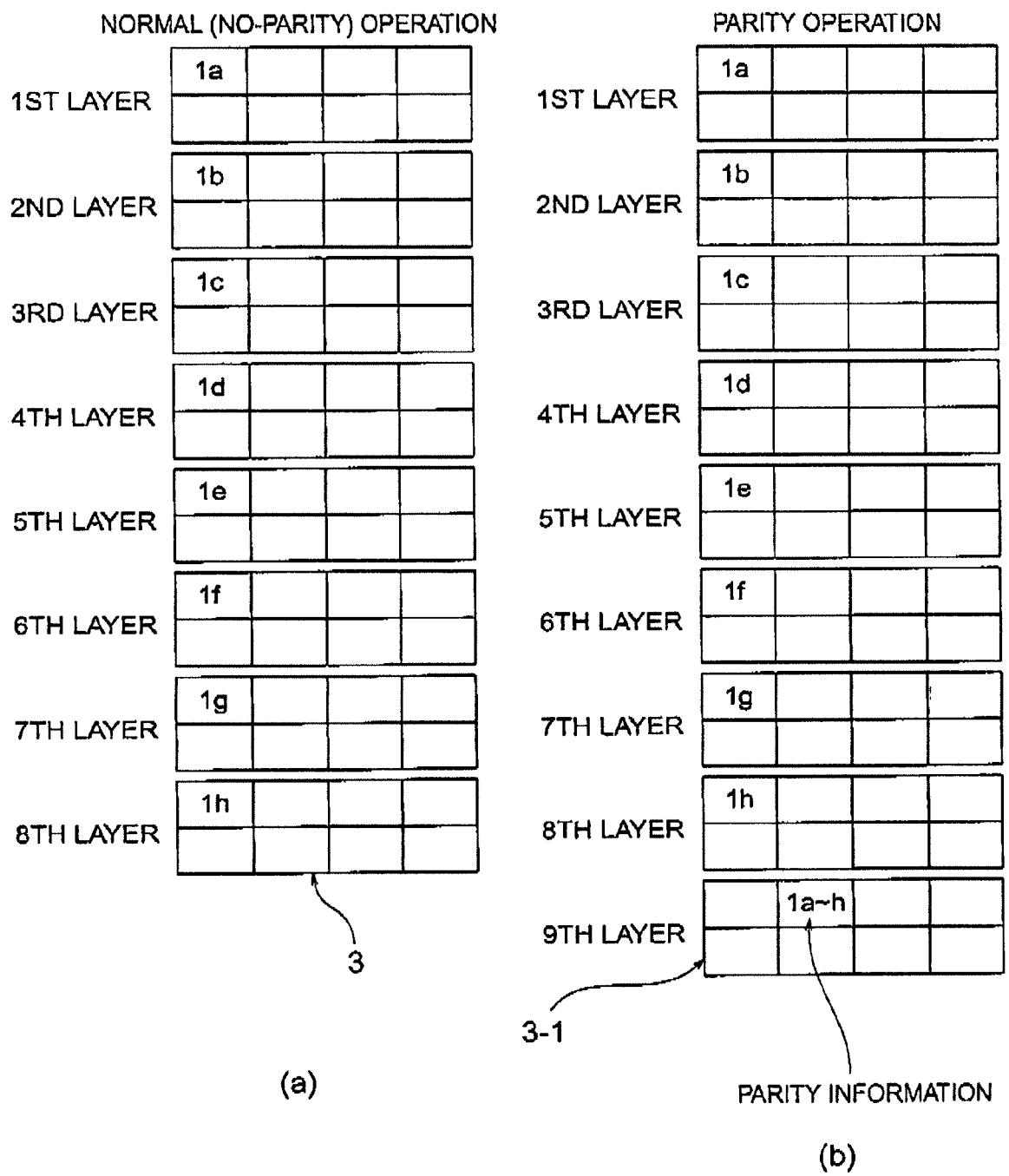
FIG. 2 is an explanatory diagram showing bank arrangements of stacked memories for parity operation and no-parity operation.
Figure 3:
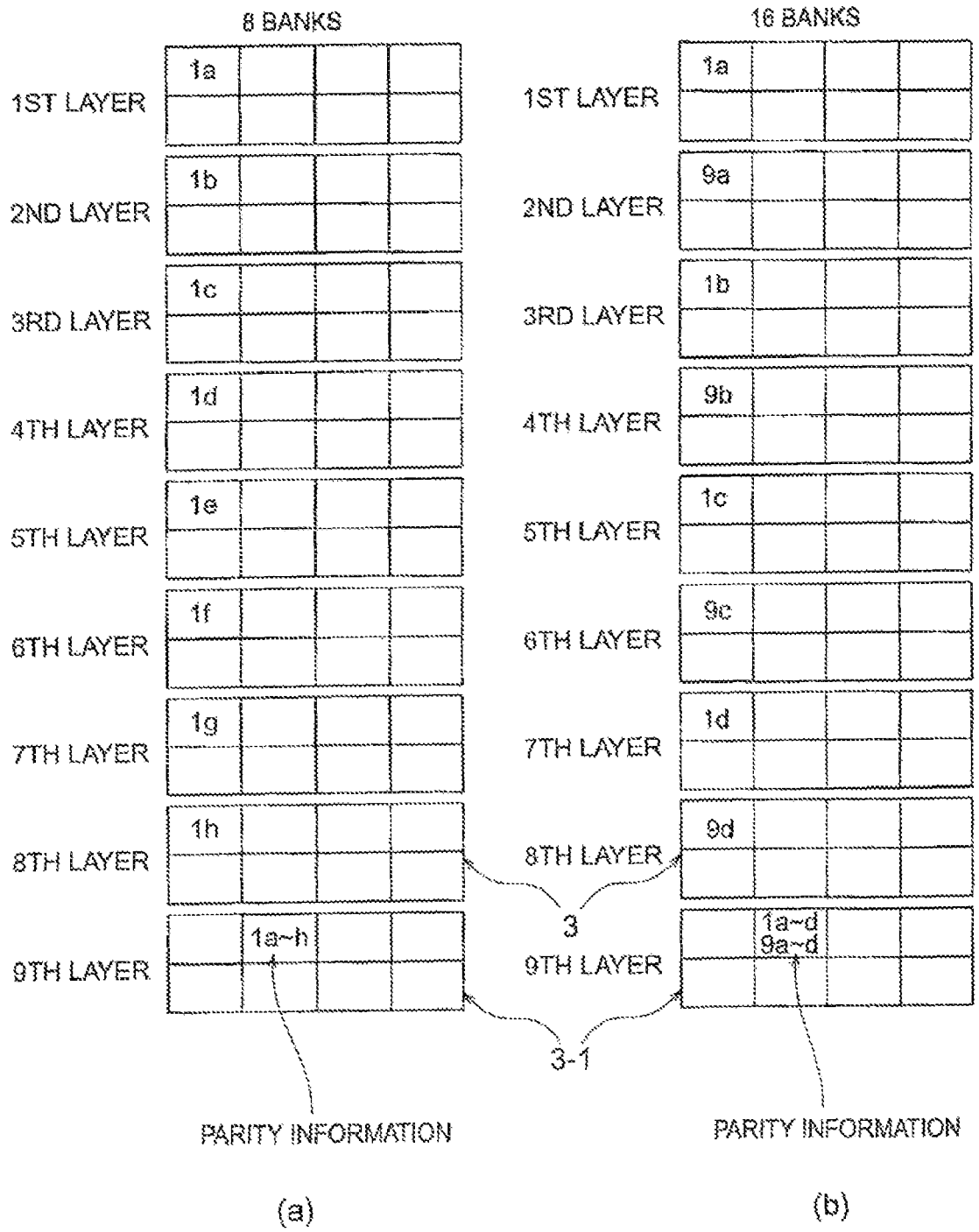
FIG. 3 is an explanatory diagram showing an 8-bank arrangement and a 16-bank arrangement of a stacked memory for parity operation.
Figure 4:
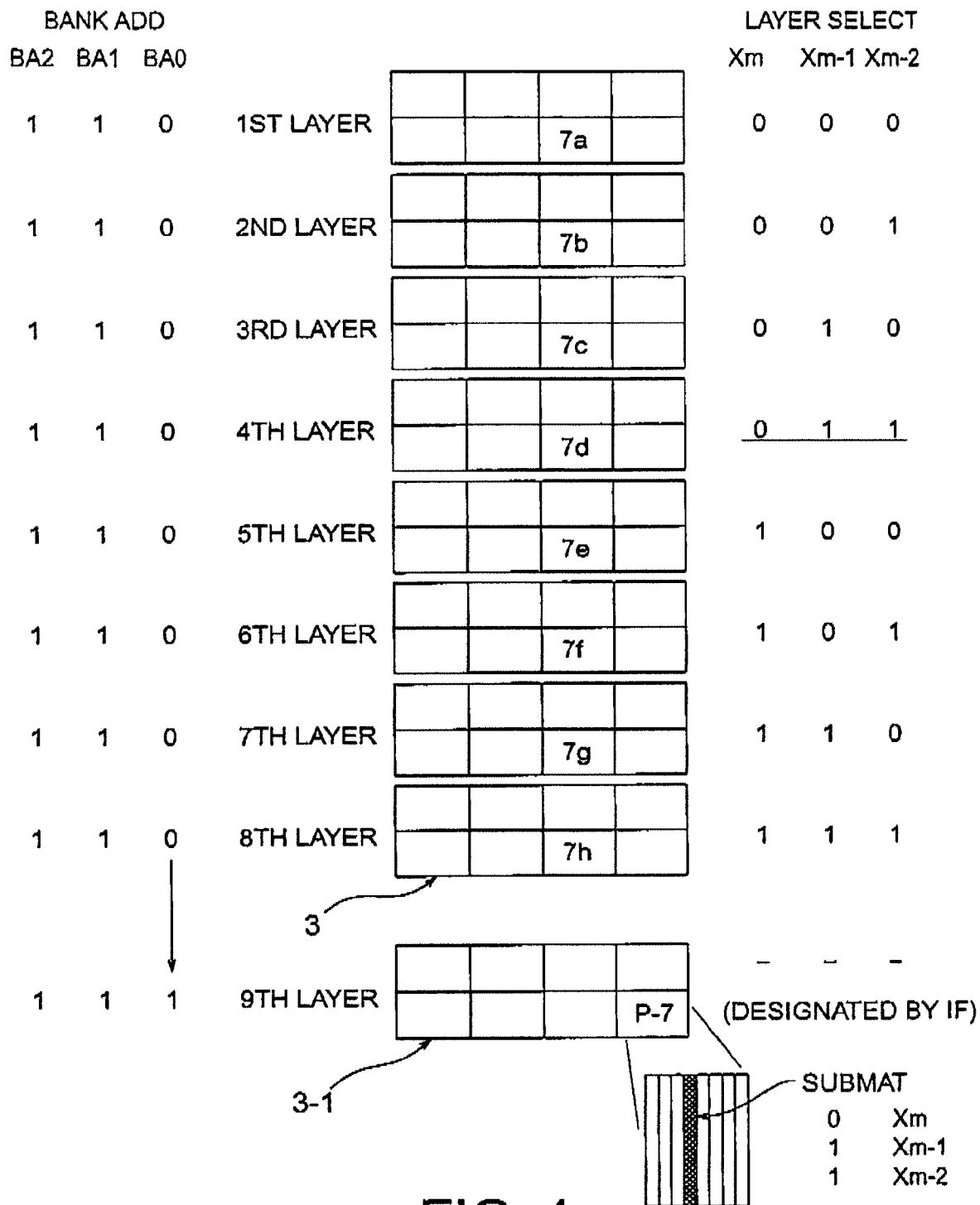
FIG. 4 is a diagram explanatory of address assignment for a bank select and a layer select in a stacked memory.

FIG. 2 is an explanatory diagram showing bank arrangements of stacked memories for parity operation and no-parity operation. FIG. 3 is an explanatory diagram showing an 8-bank arrangement and a 16-bank arrangement of a stacked memory for parity operation. FIG. 4 is an explanatory diagram of address assignment for a bank select and a layer select.

Figure 1:
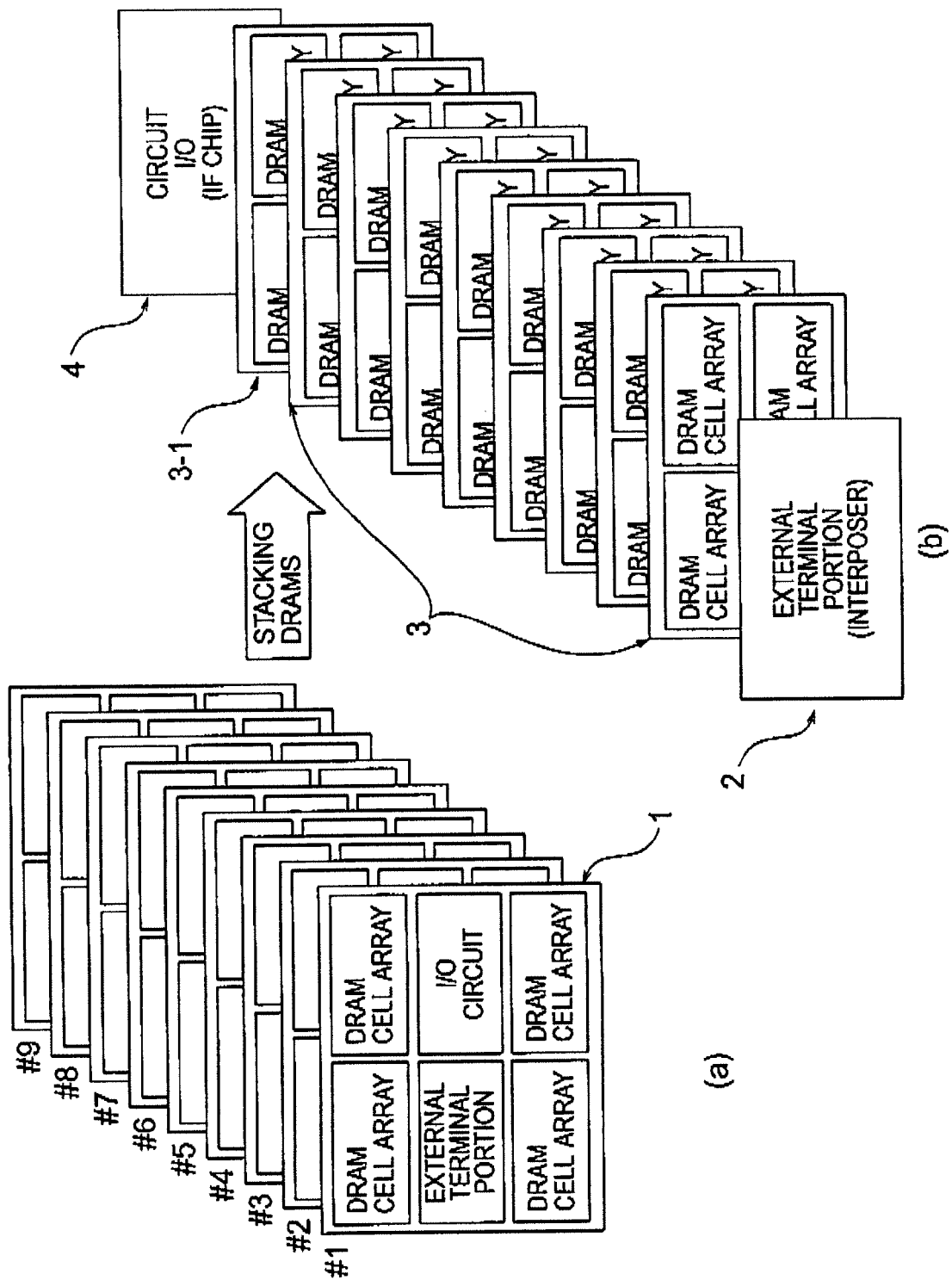
FIG. 1 is a diagram showing an entire arrangement of a stacked memory according to the present invention with a structure of a usual memory module.

Specifically, FIG. 1 (*a*) and (*b*) show a structure of a usual memory module and the layer arrangement of the stacked memory according to the present invention, respectively. In FIG. 1 (*a*), the usual memory module includes nine semiconductor memories 1 for parity operation, numbered from first through ninth memories (#1 to #9). For no-parity operation, the usual memory module includes eight semiconductor memories 1. Each of semiconductor memories 1 has a portion connected to an external terminal, an input/output circuit, and a plurality of DRAM cell arrays, namely, DRAM banks that are equal in number to four in FIG. 1. Each semiconductor memory 1 is mounted on a module substrate (not shown). Assuming that each of the semiconductor memories 1 is an 8-bit product, the memory module has a data width of 64 bits in a case of no-parity operation or a data width of 72 bit in a case of parity operation.

The stacked memory according to the present invention is used instead of the structure of the aforementioned memory module. As mentioned before, the stacked memory according to the present invention includes the external terminal (interposer) layer 2, the memory core layers 3, and the input/output circuit (IF chip) layer 4. The stacked layers are connected to each other by through electrodes (not shown in FIG. 1 (*a*)) extending through the respective layers. The interposer layer 2 is connected to external terminals and serves as a connecting portion for communicating signals from a system bus and signals from the stacked memory between the external terminals and the stacked memory.

Each of the memory core layers 3 serves as a memory portion that has the DRAM cell arrays (namely, DRAM banks) and a peripheral control circuit. The memory core layers 3 have the same arrangement as one another. In addition, each of the memory core layers 3 has through electrodes for a power source, through electrodes for a command, and a group of through electrodes for input/output operation with the DRAM banks (memory mats) operable independently of each other. The memory core layers 3 can perform a parity operation or a no-oparity operation according to the number of the stacked memory core layers 3. As shown in FIG. 1 (*b*), if the stacked memory has a parity layer 3-1, the memory core layers 3 perform a parity operation. If the stacked memory has no parity layer 3-1, the memory core layers 3 perform a no-parity operation. The parity layer 3-1 may have the same arrangement as the memory core layers 3. Thus, the parity layer 3-1 is added to the memory core layers 3 in the case of parity operation. The memory core layers 3 and the parity layer 3-1 are collectively referred to as the memory core layers 3 unless the parity layer 3-1 is required to be distinguished from the other memory core layers 3.

The input/output circuit layer 4 has an input/output circuit, which may be referred to as the IF chip, for communicating commands, addresses, input data, output data, and the like. The IF chip layer 4 has a control function of converting external signals from a system bus into signals for the memory core layers and converting signals from the memory core layers into signals for the system bus. Specifically, the IF chip layer 4 has a function of recognizing the number of the stacked memory core layers and an address assignment function of designating a memory core layer or a bank according to the recognized number of the memory core layers.

FIG. 2 shows examples of describing a layer arrangement and a bank arrangement. In the following description, each memory core layer 3 has 8-bit and 8-bank arrangement. However, the numbers of bits and banks are not limited to the illustrated example, and each memory core layer may have desired numbers of bits and banks. Specifically, the memory arrangement for no-parity (normal) operation is illustrated in FIG. 2 (*a*) while the memory arrangement for parity operation is illustrated in FIG. 2 (*b*).

In the case of no-parity operation illustrated in FIG. 2 (*a*), the stacked memory includes first to eighth layers of the memory core layers 3 each of which is divided into first through eighth banks. In the illustrated example, it is assumed that the stacked memory of the first through the eighth layers is used as a DRAM of eight banks determined by the current specification. In order to distinguish between the banks included in each memory core layer and the banks determined by the specification, the banks included in each of the first to eighth memory layers are called mats in the following description. This shows that the bank will be representative of an access unit while the mats will be representative of memory arrays geometrically arranged in each memory core layer later.

In the stacked memory of the eight banks, first mats 1*a* to 1*h* in the respective memory core layers form a first bank in the illustrated example. The through electrodes are determined by positions of the mats in each memory core layer and are assigned to the banks so that no interference takes place among signals for the respective banks. Thus, the banks can operate independently of one another.

In the case of parity operation illustrated in FIG. 2(*b*), a parity layer 3-1 is added as a ninth layer to the first to eighth layers of the memory core layers 3. With this structure, the first to eighth layers serve as data memory areas, and the ninth layer serves as a parity memory area for storing parity information. Like in FIG. 2(*a*), first mats 1*a* to 1*h* in the first to eighth layers of the memory core layers 3 form a first bank. Parity information corresponding to the first mats 1*a* to 1*h* in the first to eighth layers of the memory core layers 3 is stored in a second mat in the ninth layer of the parity layer 3-1, as illustrated in FIG. 2(*b*). In other words, parity information is not stored in a first mat in the ninth layer, This is because the parity information can not be obtained at the same time as data signals read out of the first through the eighth layers.

FIGS. 3(*a*) and (*b*) show an 8-bank arrangement with the parity layer 3-1 and a 16-bank arrangement with the parity layer 3-1, respectively. The illustrated 8-bank arrangement is the same as the arrangement in FIG. 2(*b*). In the 16-bank arrangement, the first to eighth layers of the memory core layers 3 serve as data memory areas, and the ninth layer of the parity layer 3-1 serves as a parity memory area for storing parity information.

Since the memory core layers are composed of eight layers and have the same 8-mat arrangement, the first to eighth mats in the respective memory core layers individually form first to eighth banks when the stacked memory is used as the DRAM of the 8 banks. When the stacked memory is used as the DRAM of the 16-banks, mats in odd numbered layers of the memory core layers form first to eighth banks 1 to 8 while mats in even numbered layers of the memory core layers form ninth to sixteenth banks 9 to 16. Specifically, the first mats 1*a*, 1*b*, 1*c*, and 1*d* in the odd numbered layers form the first bank while the first mats 9*a*, 9*b*, 9*c*, and 9*d* in the even numbered layers form the ninth bank. Parity information corresponding to the first mats in the first to eighth layers of the memory core layers is stored in a second mat in the ninth layer, as shown in FIG. 3(*b*).

FIG. 4 shows an address assignment method of designating a memory core layer and a bank, The example shown in FIG. 4 includes first to eighth layers of the memory core layers 3 and a ninth layer of the parity layer 3-1 and has an 8-bank structure with parity operation. The layer address assignment of the memory core layer 3 is defined by 3 bits (Xm, Xm−1, Xm−2) of MSB of the row address. The ninth layer of the parity layer 3-1 can be designated by the IF chip layer by converting the row address.

As shown in FIG. 4, 3 bits (BA2, BA1, BA0) which serves to designate a bank address are used to designate a mat address of each memory layer of the memory core layer 3. In this case, a mat of each memory core layer is identical with a bank in the illustrated example. Moreover, LSB (BA0) of 3 bits (BA2, BA1, BA0) of the bank address is inversed to generate an address for designating a mat in the parity layer. By using the address in which LSB (BA0) of the bank address is inversed, any interference in other layers does not take place when parity information is received or transmitted. The mat activation in the parity layer is performed concurrently with activation of the corresponding mats. Accordingly, interactive operation should be limited about banks of the same BA2 and BA1 in the bank address. In the illustrated example, mats in the memory core layers correspond to banks of the stacked memory, banks and mats might be considered to have the same meaning.

In the parity layer 3-1 illustrated in FIG. 4, parity information of the same mat in the memory core layers is stored in one bank of the 8-bank structure. As shown in FIG. 4, one mat in the parity layer 3-1 is divided into eight regions (submats) corresponding to the eight banks. The regions (submats) are individually accessed by selection addresses (Xm, Xm−1, Xm−2) of the corresponding layers. For example, parity information of the seventh bank of the fourth layer (specified by Xm=0, Xm−1=1, Xm−2=1) of the memory core layers is stored in a fourth region (submat) (Xm=0, Xm-1=1, Xm-2=1) of the eighth mat in the parity layer. Thus, the submat is designated by the selection address (Xm, Xm-1, Xm-2) of the layer.

The stacked memory according to the present invention includes an external terminal (interposer) layer 2 for connection with external terminals, the plurality of memory core layers 3, and the IF chip layer 4. The memory core layers 3 have an identical arrangement with one another. In the case of parity operation, a parity layer for parity operation is added as mentioned before in the manner illustrated in FIG. 4. With regard to address assignment, bits of MSB of the row address are assigned to a layer designation of the memory core layers, and a bank address is assigned to a bank designation. The respective banks correspond to mats in the illustrated memory core layers in FIG. 4. Mats in the parity layer are arranged so that a layer and a bank of the parity layer are designated by the IF chip layer and a bank address in which LSB is inversed, respectively. Addresses corresponding to layer designation addresses of the respective memory core layers are assigned to the submat regions in which parity information is stored. The aforementioned address assignment is performed by the IF chip layer.

As described above, the stacked memory according to the present invention is formed by stacking a plurality of the same memory core layers 3 having through electrodes, the interposer (external terminal) layer 2 for connection with the external terminals, and the IF chip layer 4. The parity layer 3-1 is added to perform a parity operation. By optimizing the address assignment with the IF chip layer, the stacked memory can selectively perform a no-parity operation and a parity operation and can take various bank arrangements.

EXAMPLE 1

Example 1 according to the present invention will be described with reference to FIGS. 5 through 9. This example 1 relates to an address assignment method on the assumption that a number of banks is constant and while the memory core layers each of which has eight mats are varied in number. Although the stacked memory having eight memory core layers has thus far been described as a basic form in the above embodiment, description is made about cases in which a stacked memory has different numbers of memory core layers (one, two, four, and eight layers) in Example 1.

FIG. 5 is a diagram of conventional bank arrangements to show possible problems. FIG. 6(a) is a table showing an address assignment for designating a layer and a bank in an 8-bank arrangement. FIG. 6(b) is a diagram showing B-bank arrangements in various cases. FIG. 7(a) is a table showing an address assignment for designating a layer and a bank in a 16-bank arrangement. FIG. 7(b) is a diagram showing 16-bank arrangements in various cases. FIG. 8(a) is a block diagram for explaining mat selection by the use of programmable address decoders. FIG. 8(b) is a circuit diagram of the programmable address decoder 6 shown in FIG. 8(a). FIG. 8(c) is a logical table of the programmable address decoder 6 shown in FIG. 8(a). FIG. 9(a) is a block diagram for explaining mat selection with use of comparators. FIG. 9(b) is a circuit diagram of the comparator shown in FIG. 9(a).

FIG. 5 shows conventional bank arrangements in which memory core layers having eight banks are simply stacked. As shown in FIG. 5(a), one memory core layer has first to eighth mats numbered from 1 to 8 which form first to eighth banks 1, respectively. In FIG. 5(b), when two memory core layers have each eight mats and are stacked together, mats of the two memory core layers are handled as individual banks. As a result, the bank arrangement has banks 1 to 16. Similarly, in a case of four memory core layers (FIG. 5(c)), mats of the four memory core layers are handled as individual banks and thus, the bank arrangement has banks 1 to 32. In a case of eight memory core layers, the bank arrangement has banks 1 to 64. Thus, each bank arrangement has banks equal to the total number of banks included in the memory core layer(s). This shows that the number of banks independently operating in the stacked memory widely varies depending on the number of the stacked memory core layers.

The number of banks varies according to the number of stacks in a conventional method in which all mats independently operate and correspond to banks. In other words, the mats in the respective memory core layers are in one-to-one correspondence with the banks. This problematically causes unconformity to current DRAM specifications. General DRAM specifications have a constant range of 4 to 16 banks (8 to 16 banks in a case of a large-capacity DRAM). The stacked memory is required to cope with such specifications. In this example, the numbers of the memory core layers are powers of two but may be other values.

FIG. 6(a) is a table showing an address assignment for designating a layer and a bank in an 8-bank arrangement, and FIG. 6(b) is a diagram showing 8-bank arrangements in various cases. In the cases of 8-bank arrangements having one, two, four, and eight layers of the memory core layers 3, mats 1 to 8 in each memory core layer 3 are made to correspond to banks 1 to 8 of the stacked memory. Since the bank conforms to the mat in each memory core layer, the bank designates each mat in each memory core layer by a bank address BA0, BA1, BA2. In the case of the 8-bank arrangement, a bank address BA3 may not be used.

Figure 6:
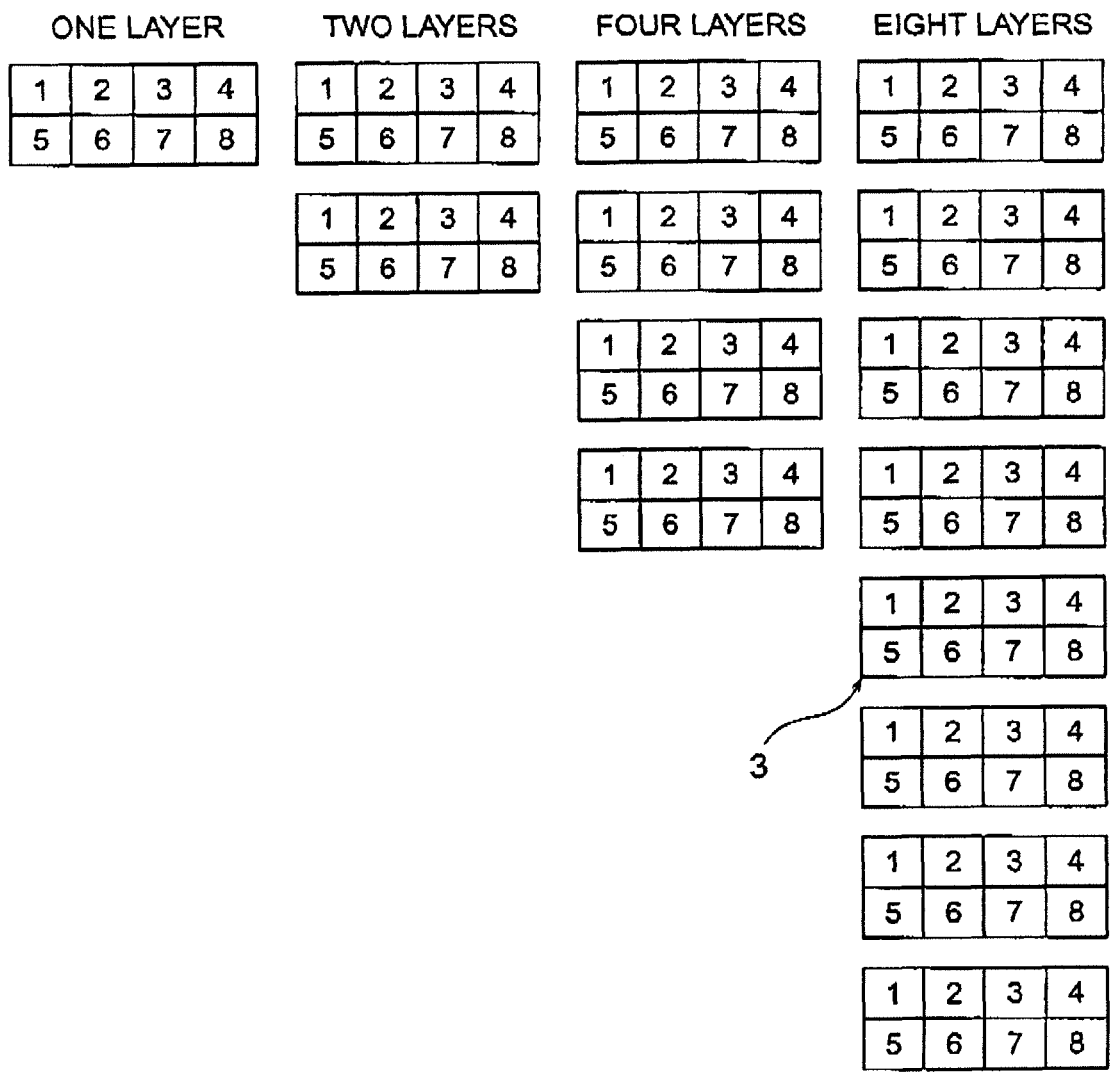
FIG. 6 shows: (a) table showing an address assignment for designating a layer and a bank in an 8-bank arrangement and (b) a diagram showing 8-bank arrangements in various cases.
Figure 7:
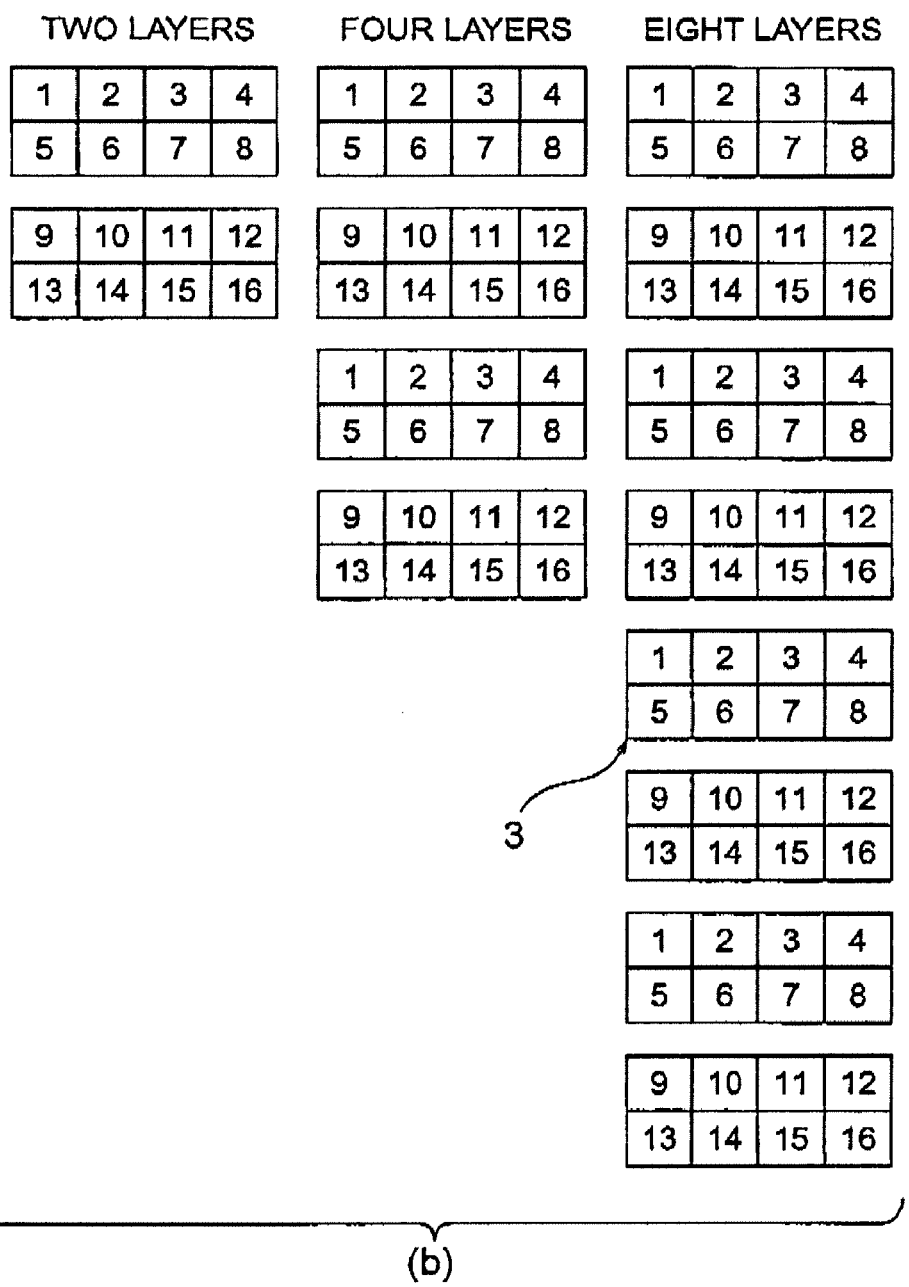
FIG. 7 shows: (a) a table showing an address assignment for designating a layer and a bank in a 16-bank arrangement and (b) a diagram showing 16-bank arrangements in various cases.

Address bit(s) are added to MSB of the row address to designate a layer of the memory core layers 3 and are specified by R-MSB (+1bit), R-MSB (+2bit), and R-MSB(+3bit) in FIG. 6 (a). In a case of two memory core layers, address 1 bit is added to MSB of the row address so as to designate a layer of the memory core layers with the added address 1 bit. In a case of four memory core layers, address 2 bits are added to MSB of the row address so as to designate a layer of the memory core layers with the added address 2 bits. In a case of eight memory core layers, address 3 bits are added to MSB of the row address so as to designate each layer of the memory core layers with the added address 3 bits. Thus, a memory core layer is designated by an address added to MSB of the row address.

Thus, each memory core layer is designated by address bit(s) added to MSB of the row address (namely, R-MSB+1, R-MSB+2, R-MSB+3), and a bank is designated by a bank address BA0, BA1, BA2 in the stacked memory. Bank arrangements shown in FIG. 6(b) are composed of eight banks irrespective of the number of the memory core layers. With such address assignment, all of the memory core layers are designated by addresses under the same conditions. Accordingly, every memory core layer is equally addressed. Thus, the memory cores have the same performance irrespective of positions of the layers. There is no difference in performance between the layers.

FIG. 7(a) is a table showing an address assignment for designating a layer and a bank in a 16-bank arrangement, and FIG. 6(b) is a diagram showing 16-bank arrangements in various cases. In the cases of 16-bank arrangements, the number of the mats in the memory core layer (8 mats) does not conform to the number of the banks in the stacked memory (16 banks). Accordingly, a half of the mats (mats 1 to 8) should be assigned to banks 1 to 8 while another half of the mats should be assigned to banks 9 to 16. In the following example, addresses are converted so that mats in odd layers of the memory core layers are assigned to banks 1 to 8 while mats in even layers of the memory core layers are assigned to banks 9 to 16. An odd layer or an even layer of the memory core layers is designated by a bank address BA3. The bank address BA3 thus serves as an address for designating a bank address as well as an address for designating a layer, as shown in FIG. 7(a).

Mats 1 to 8 in odd layers are assigned to banks 1 to 8 by the bank address BA3 while mats 1 to 8 in even layers are assigned to banks 9 to 16 by adding eight. Each mat in a memory core layer is designated by a bank address BA0, BA1, BA2. Bank arrangements thus addressed are shown in FIG. 7(b).

Further, address bit(s) are added to MSB of the row address (R-MSB+1, R-MSB+2, R-MSB+3) so as to designate a layer of the memory core layers. In a case of two memory core layers, a layer of the memory core layers is designated by the bank address BA3. In a case of four memory core layers, address 1 bit is added to MSB of the row address so as to designate a layer of the memory core layers by the use of the added address 1 bit and the bank address BA3. In a case of eight memory core layers, address 2 bits are added to MSB of the row address so as to designate a layer of the memory core layers by the use of the added address 2 bits and the bank address BA3. Thus, a memory core layer is designated by the bank address BA3 and address bit(s) added to MSB of the row address.

For address assignment, the bank address bit BA3 and the address bit(s) added to MSB of the row address are assigned to the memory core layer. The bank address is assigned to the bank. With such address assignment, all of the memory core layers are designated by addresses under the same conditions. Accordingly, every memory core layer is equally addressed. Thus, the memory cores have the same performance irrespective of positions of the layers. There is no difference in performance between the layers.

Figure 8:
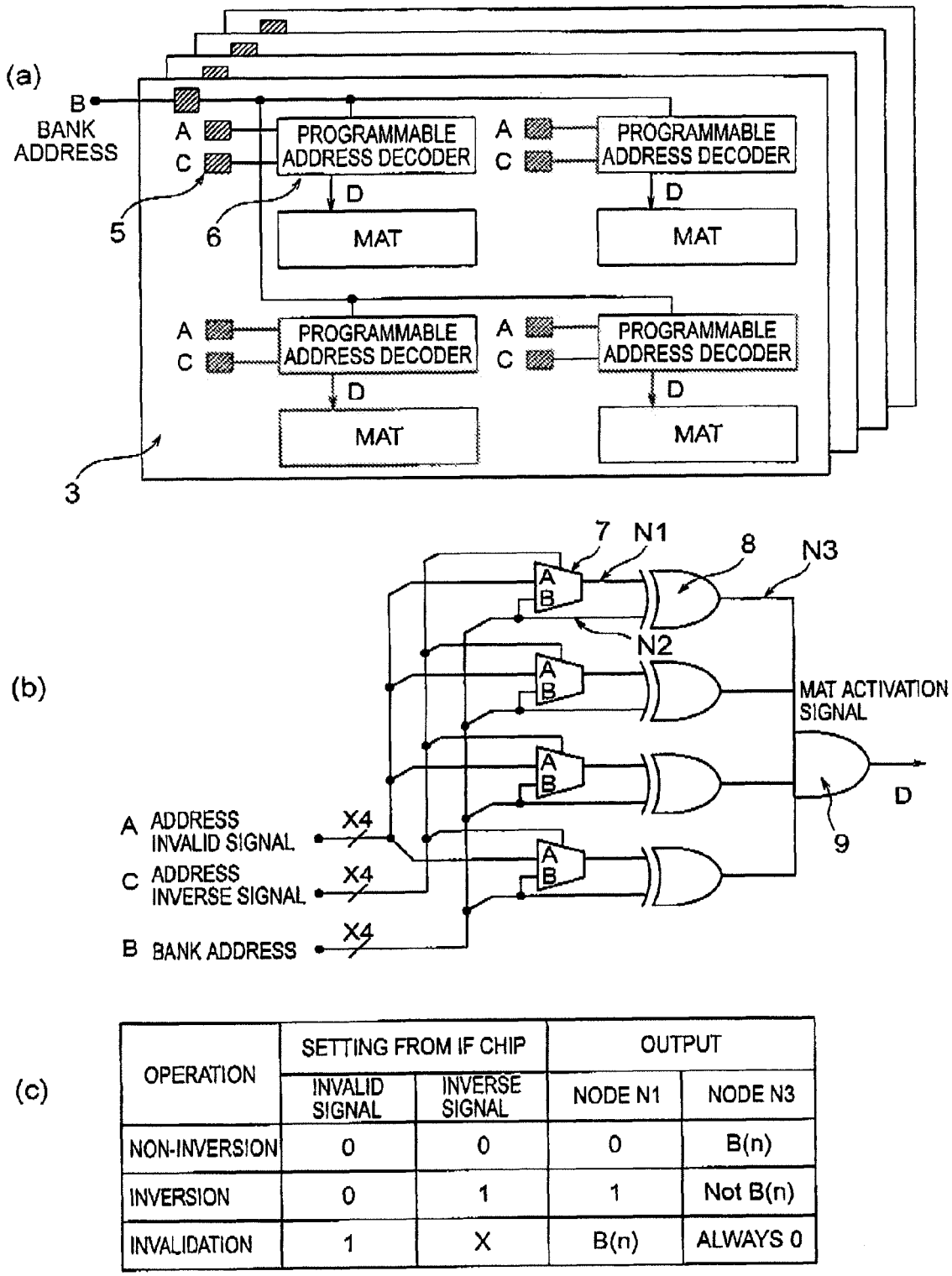
FIG. 8 shows: (a) a block diagram explanatory of mat selection with use of programmable address decoders, (b) a circuit diagram of the programmable address decoder shown in (a), and (c) a logical table of the programmable address decoder shown in (a)
Figure 9:
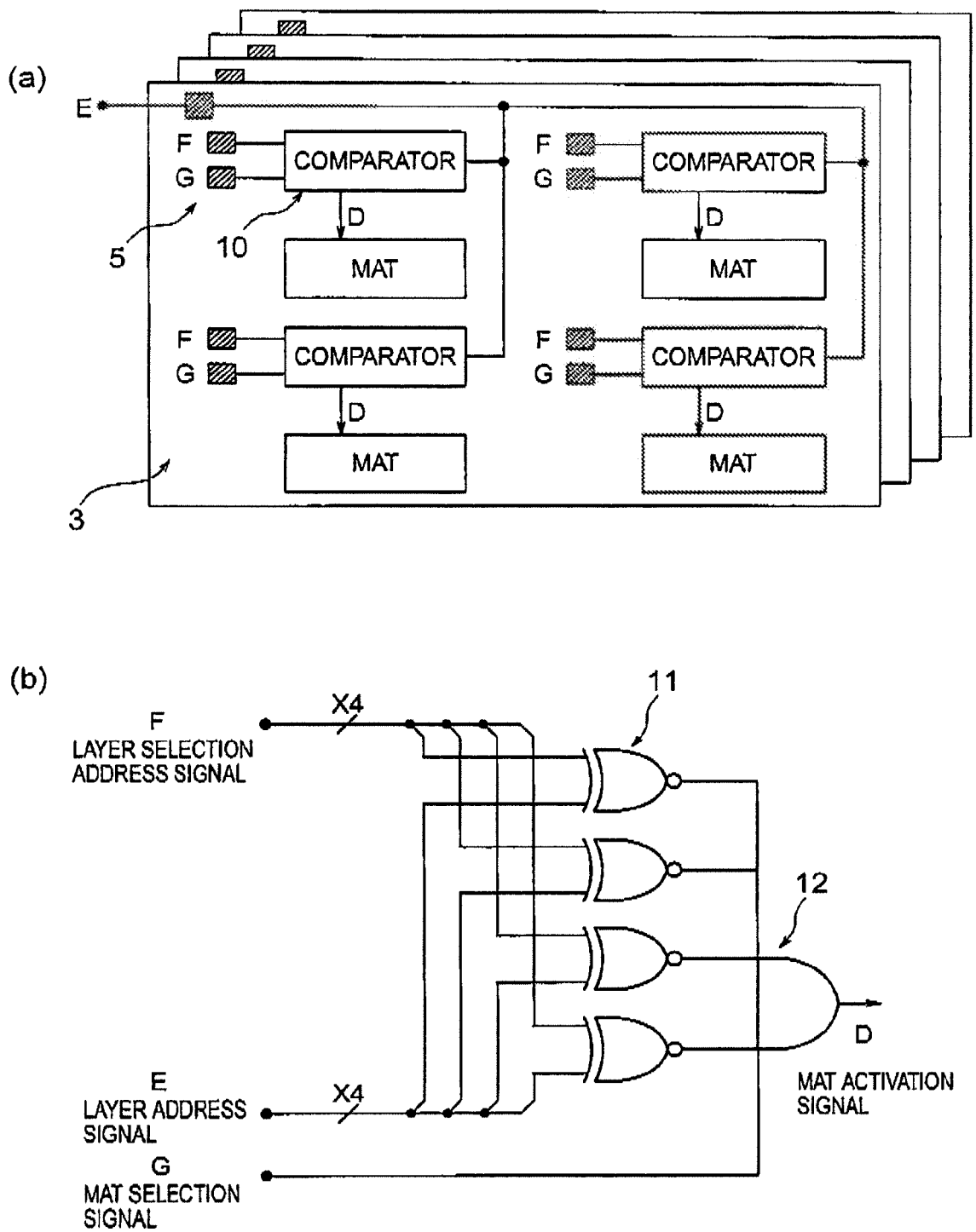
FIG. 9 shows: (a) a block diagram explanatory of mat selection with use of comparators, and (b) a circuit diagram of the comparator shown in (a)

Examples in which banks are assigned regularly in the order of the mats have been described above. However, mats and banks may arbitrarily be assigned. FIGS. 8 and 9 show such flexible bank arrangements. FIG. 8 shows a mat selection method with use of programmable address decoders. FIG. 9 shows a mat selection method with use of comparators. A 16-bank arrangement is applied to FIGS. 8 and 9. Four bits are required as address bits.

In the mat selection method with use of programmable address decoders, each of the memory core layers 3 has a plurality of through electrodes 5 and programmable address decoders 6 for selecting a corresponding mat. A bank address invalid signal A, a bank address signal B, and a bank address inverse signal C are inputted from the through electrodes 5 into each programmable address decoder 6. FIG. 8(b) is a circuit diagram of the programmable address decoder 6, and FIG. 8(c) is a logical table of the programmable address decoder 6.

The bank address signal B supplies a common address to the respective chips and mats. The bank address invalid signal A and the bank address inverse signal C are inputted into each mat at the time of initialization. Each of selectors 7 switches the address invalid signal A and the bank address B by the address inverse signal C at the time of initialization. With the initialization, a potential of an output node N1 of each selector 7 is set and inputted into an EXCLUSIVE-OR circuit 8.

Each of the EXCLUSIVE-OR circuits 8 judges consistency and inconsistency of nodes N1 and N2. The EXCLUSIVE-OR circuit 8 outputs an inputted bank address B(n) to an AND circuit 9 when the address is not inversed, outputs an inversed NOT B(n) to the AND circuit 9 when the address is inversed, and outputs a low level "0" to the AND circuit 9 when the address is invalid. The AND circuit 9 outputs a mat activation signal D. Here, the bank address B(n) represents a bank address B for each bit. The bank address B represents a bank address BA0 to BA3.

As shown in the logical table, non-inversion, inversion, and invalidation of the bank address B can be specified for each bit of the bank address B by the address inverse signal C and the address invalid signal A. A desired mat can be selected by specifying non-inversion, inversion, and invalidation of the bank address B for each bit, For example, a third mat in an odd layer is to be designated as a fifth bank. At that time, an inputted bank address B is (0, 1, 0, 0). The address is inputted for each bit from an upper side of the decoder circuit shown in FIG. 8(b). When a third mat in an odd layer is initialized, the nodes N1 are set to be inversion, non-inversion, inversion, and inversion (1, 0, 1, 1). Since the inputted bank address B is (0, 1, 0, 0), all outputs of nodes N3 have a high level. Thus, the third mat in the odd layer is selected and activated. With regard to other mats, any of the outputs of the nodes N3 has a low level, and the mats are not activated. This selection method allows flexible mat selection and achieves flexible bank arrangements.

In the mat selection method with use of comparators shown in FIG. 9, each of the memory core layers 3 has a plurality of through electrodes 5 for signals and comparators 10 for selecting a corresponding mat. A layer address signal E, a layer selection address signal F, and a mat selection signal G, which are common to the respective mats in the respective layers, are inputted from the through electrodes 5 into each comparator 10. FIG. 9(b) is a circuit diagram of the comparator 10.

The layer address signal E and the layer selection address signal F are inputted into each EXCLUSIVE-NOR circuit 11. Each of the EXCLUSIVE-NOR circuits 11 judges consistency and inconsistency of the layer address signal E and the layer selection address signal F and outputs the results to an AND circuit 12. The mat selection signal G is additionally inputted into the AND circuit 12. The AND circuit 12 outputs the mat activation signal D. When the layer address signal E and the layer selection address signal F are consistent with each other while the mat selection signal G has a high level, the mat activation signal D is activated so as to select the mat in the layer. The layer address signal E is specified at the time of initialization. Selection of the memory core layer is performed by the layer address, and mat selection of the mat is performed by the mat selection signal G. This selection method allows flexible mat selection and achieves flexible bank arrangements.

In the stacked memory of the present example, a plurality of memory core layers having the same arrangement are stacked, and address setting is conducted so as to maintain a constant number of banks. The address setting allows mats in the memory core layers to be designated and selected as banks of the stacked memory. Accordingly, it is possible to achieve a desired constant number of banks in the stacked memory. The memory core layer is designated by the significant address added to the row address and the significant bank address. The bank address sets the mat in the memory core layer with the bank address signal. Further, flexible bank designation can be achieved by the programmable address decoders or the comparators. The stacked memory has a desired number of memory core layers. The mats in the memory core layers are flexibly set as banks of the stacked memory. Thus, the stacked memory can have a constant number of banks.

EXAMPLE 2

Figure 10:
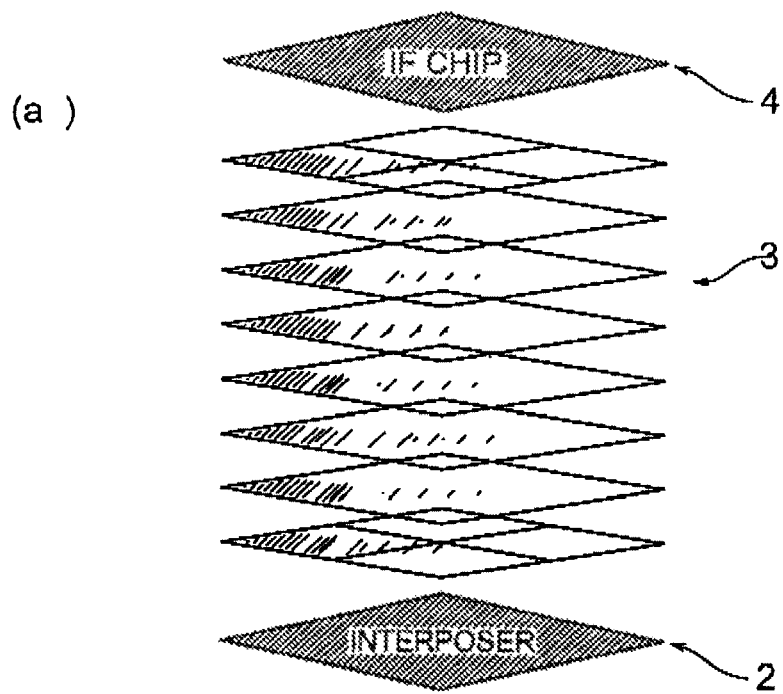
FIG. 10 shows: (a) a diagram showing a stacked memory for explanation of a refresh control method, (b) a diagram showing a bank arrangement in a case of two lines of counters, and (c) a diagram showing a bank arrangement in a case of four lines of counters.
Figure 10:
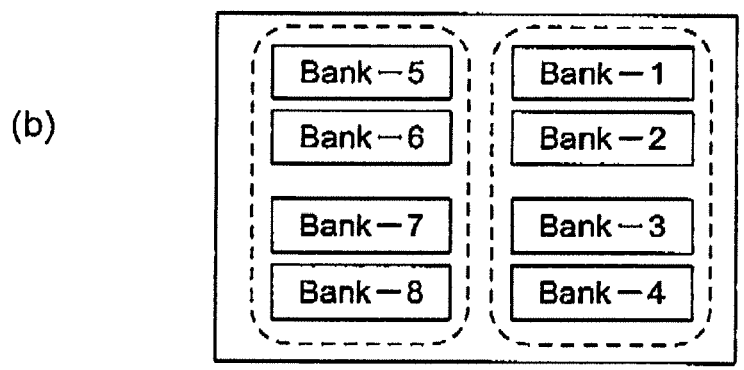
Figure 10:
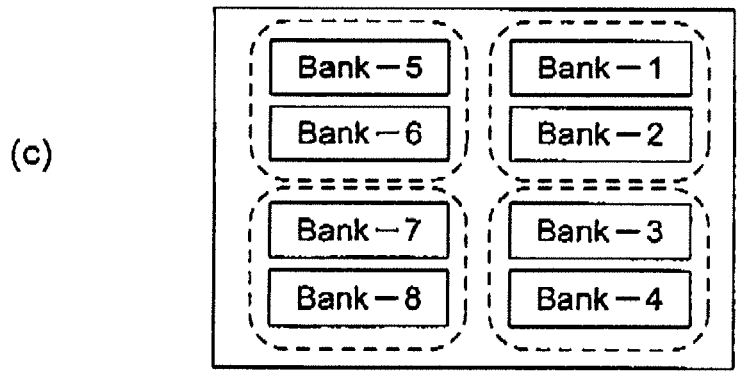

Example 2 will be described with reference to FIG. 10. This example relates to a refresh control in a stacked memory. FIG. 10(a) is a diagram showing a stacked memory for explanation of the refresh control. FIG. 10(b) is a diagram showing a group arrangement of banks to be refreshed in a case of two lines of refresh counters. FIG. 10(c) is a diagram showing a group arrangement of banks to be refreshed in a case of four lines of refresh counters.

The stacked memory includes an interposer 2, a plurality of memory core layers 3, and an IF chip 4. The layers are connected to each other by through electrodes. A refresh control in the stacked memory is performed by the IF chip 4. The IF chip 4 has refresh counters for the refresh control. When the IF chip 4 has two lines of refresh counters, two groups of banks 1 to 4 and banks 5 to 8 are designated by 1 bit of MSB of the bank address BA. Each group is refreshed as shown in FIG. 10(b). When the IF chip 4 has four lines of refresh counters, four groups of banks 1 and 2, banks 3 and 4, banks 5 and 6, and banks 7 and 8 are designated by 2 bits of MSB of the bank address BA. Each group is refreshed as shown in FIG. 10(c).

In a case of auto-refresh, refresh is performed for each group. A bank in which data is stored and a bank for the corresponding parity layer are in the same group. This can similarly be applied to other refresh processes. Power-down state of each memory core layer is set or cancelled by a signal from the IF chip 4. In a case of self-refresh in the power-down state, the IF chip 4 controls all of the layers.

In the present example, the IF chip has refresh counters for refreshing grouped banks. A desired bank can be selected by the bank address. Accordingly, the stacked memory can automatically perform a refresh process with the refresh counters.

Although some examples of the present invention have been described in detail, it should be understood that the present invention is not limited to those examples, and that various changes and modifications may be made therein without departing from the scope of the appended claims.

What is claimed is:

1. A memory device
   a plurality of memory core layers each including a plurality of through electrodes; and
   an interface chip including a plurality of electrodes;
   the memory core layers being stacked over the interlace chip with one another such that the through electrodes of a lower one of the memory core layers are connected respectively to the through electrodes of an upper one of the memory core layers and the through electrodes of a lowest one of the memory core layers are connected respectively to the through electrodes of the interface chip;
   each of the memory core layers further including a plurality of memory banks each containing a plurality of memory cells;
   the interface chip generating bank address information and supplying the bank address information in common to the memory core layers via the through electrodes to designate memory banks belonging respectively to the memory core layers;
   the interface chip further generating row address information and supplying the row address information in common to the memory core layers via the through electrodes, the row address information comprising a more significant bit part and a less significant bit part, one or more bits belonging to the more significant bit part being allocated as layer selection information to select one of the memory core layers; and
   the interface chip performing, in response at least to the less significant bit part of the row address information, a data read/write operation on a memory bank which is contained in the memory banks designated by the bank address information and which belongs to one of the memory core layers that is selected by the one or more bits belonging to the more significant bit part of the row address information.

2. The memory device according to claim 1, wherein:
   the memory device further comprises a parity layer which is the same structure as one of the memory core layers, wherein the parity layer and the memory core layers are stacked on each other;
   wherein:
   the parity layer includes a plurality of through electrodes which are connected respectively to the plurality of through electrodes of the memory core layers,
   the parity layer further including a plurality of memory banks each containing a plurality of memory cells,
   the interface chip supplying the bank address information in common to the memory core layers and the parity layer via the through electrodes to designate memory banks belonging respectively to the memory core layers and the parity layer,
   the parity layer inverting a part of the bank address information and selecting one memory bank of the parity layer differing from the memory bank which the memory core layers selects,
   wherein:
   the one memory bank of the parity layer is designated by the bank address information which comprises the inverting of a part of the bank address information, and
   the parity layer activates together with activation of selected ones of the memory core layers regardless of the more significant bit part of the row address information.

3. The memory device according to claim 2, wherein
   the memory banks of the parity layer each include a plurality of sub mats, and the sub mats are allocated to the more significant bit part of the row address information respectively.

4. The memory device according to claim 1, wherein
   each of the memory core layers further includes a programmable address decoder each programming a choice combination of the plurality of memory banks which the bank address information indicates.

5. The memory device according to claim 4, wherein:
   the programmable address decoder comprises a selector including a first and a second input nodes and including a logic gate which including a third and a fourth input nodes, wherein
   the bank address information is supplied to the first input node,
   an invalid address signal invalidating the bank address information is supplied to the second input node, the bank address information is supplied to the third input node,
   an output node of the selector connects to the fourth input node.

6. The memory device according to claim 1, wherein
   each of the memory core layers comprises a comparator to compare with a layer address information which defines the memory core layers respectively and the more significant bit part of the row address information.

7. The memory device according to claim 6, wherein
   the comparator comprises a first logic gate and a second logical gate, wherein the first logic gate compares the more significant bit part with the layer address information, and the second logic gate is supplied with a mat selection signal selecting one of the plurality of memory banks and a signal of an output node of the first logic gate.

8. The memory device according to claim 1, wherein:

the interface chip further comprises a plurality of refresh counters, the plurality of memory banks in each of the memory core layers are defined by a plurality of refresh groups corresponding to a number of the plurality of refresh counters respectively, and each of a refreshment of the plurality of refresh groups is controlled by each of the plurality of refresh counters.

9. The memory device according to claim 8, wherein:

the memory device further comprises a parity layer which is the same structure as one of the memory core layers, the parity layer and the memory core layers are stacked on each other, the parity layer comprises a plurality of memory banks, the plurality of memory banks of the parity layer are defined by a plurality of refresh groups corresponding to the number of the plurality of refresh counters respectively, and the plurality of refresh groups of the parity layer corresponds with the plurality of refresh groups of the memory core layers respectively.

10. The memory device according to claim 1, wherein:

the memory core layers are assigned to plural groups which each contain the same number of the memory core layers and each contain at least more than one of the memory core layers, the more significant bit part of the row address information containing plural bits, the interface chip allocating part of the more significant bit in part of the row address information as part of the bank address information, the interface chip selecting one of the memory bank which is contained in memory banks in one of the plural groups designated by the part of bank address information, and the interface chip further selecting one of the plural groups by remaining part of the more significant bit part of the row address information.

11. The memory device according to claim 10, wherein:

the memory device further comprises a parity layer which is of the same structure as one of the memory core layers, the parity layer and the memory core layers are stacked on each other, wherein the parity layer includes a plurality of through electrodes which are connected respectively to the plurality of through electrodes of the memory core layers, parity layer further including a plurality of memory banks each containing a plurality of memory cells, the interface chip supplies the bank address information in common to the memory core layers and the parity layer via the through electrodes to designate memory banks belonging respectively to the memory core layers and the parity layer, the parity layer inverting in a part of the bank address information and selecting one memory bank of the parity layer differing the memory bank which the memory core layers selects, the one memory bank of the parity layer is designated by the bank address information which comprises the inverting in a part of the bank address information, and the parity layer activates together in activity of selected one of the memory core layers regardless of the more significant bit part of the row address information.

12. The memory device according to claim 11, wherein the memory banks of the parity layer each including a plurality of sub mats, and the sub mats are allocated the more significant bit part of the row address information respectively.

13. The memory device according to claim 10, wherein each of the memory core layers further including a programmable address decoder each programming a choice combination of the plurality of memory banks which the bank address information indicates.

14. The memory device according to claim 13, wherein the programmable address decoder comprises a selector including a first and a second input nodes and including a logic gate which including a third and a fourth input nodes, the bank address information is supplied to the first input node, an invalid address signal invalidating the bank address information is supplied to the second input node, the bank address information is supplied to the third input node, and an output node of the selector connects to the fourth input node.

15. The memory device according to claim 10, wherein each of the memory core layers comprises a comparator to compare with a layer address information which defines the memory core layers respectively and the more significant bit part of the row address information.

16. The memory device according to claim 15, wherein:

the comparator comprises a first logic gate and a second logical gate, the first logic gate compares the more significant bit part with the layer address information, and the second logic gate is supplied with a mat selection signal selecting one of the plurality of memory banks and a signal of an output node of the first logic gate.

17. The memory device according to claim 10, wherein:

the interface chip further comprises a plurality of refresh counters, the plurality of memory banks in each of the memory core layers are defined by a plurality of refresh groups corresponding to a number of the plurality of refresh counters respectively, each of a refreshment of the plurality of refresh groups is controlled by each of the plurality of refresh counters.

18. The memory device according to claim 17, wherein the memory device further comprises a parity layer which is same structure as one of the memory core layers, the parity layer and the memory core layers are stacked on each other, the parity layer comprises a plurality of memory banks, the plurality of memory banks of the parity layer are defined by a plurality of refresh groups corresponding to the number of the plurality of refresh counters respectively, and the plurality of refresh groups of the parity layer corresponds with the plurality of refresh groups of the memory core layers respectively.

* * * * *